United States Patent [19]

Stephan et al.

[11] Patent Number: 4,923,850
[45] Date of Patent: May 8, 1990

[54] SUPERCONDUCTING DC SQUID MAGNETOMETER WORKING IN LIQUID NITROGEN

[75] Inventors: Ronan Stephan, Locmaria Plouzane; Martine Doisy, Plougonvelin; Yves Montfort, Herouville St Clair; Didier Robbes, Verson; Marc L. C. Sing, Herouville St Clair; Daniel Bloyet; Jackie Provost, both of Thaon; Bernard Raveau, Beuville, all of France

[73] Assignee: Thomson-CSF, Puteaux, France

[21] Appl. No.: 258,765

[22] Filed: Oct. 17, 1988

[30] Foreign Application Priority Data

Oct. 20, 1987 [FR] France ............... 87 14454

[51] Int. Cl.$^5$ ............... G01R 33/02; H03H 3/38
[52] U.S. Cl. ............... 505/1; 505/846; 324/248
[58] Field of Search ............... 324/248; 307/306; 505/845, 846

[56] References Cited

U.S. PATENT DOCUMENTS

| | | | |
|---|---|---|---|
| 3,335,363 | 8/1967 | Anderson et al. | 324/248 |
| 3,528,005 | 9/1970 | Morse et al. | 324/248 |
| 4,366,494 | 12/1982 | Ohta | 324/248 |
| 4,389,612 | 6/1983 | Simmonds et al. | 324/248 |

OTHER PUBLICATIONS

Physical Review B: Condensed Matter, vol. 33, No. 7, Apr. 1, 1986, pp. 5114–5117; Buttiker et al.
GEC Journal of Research, vol. 2, No. 4, 1984, pp. 205–217; B. R. Barnard.

*Primary Examiner*—Reinhard J. Eisenzopf
*Assistant Examiner*—Walter E. Snow
*Attorney, Agent, or Firm*—Oblon, Spivak, McClelland, Maier & Neustadt

[57] ABSTRACT

A superconducting magnetometer, using a superconducting compound at the temperature of liquid nitrogen, is disclosed. It consists in the use, as a sensitive element, of a piece of superconducting material with a central constriction enabling the demarcation of a channel in which the number of useful, intrinsic loops is sufficiently limited for the sensitive element to behave like a DC SQUID with a single loop.

3 Claims, 2 Drawing Sheets

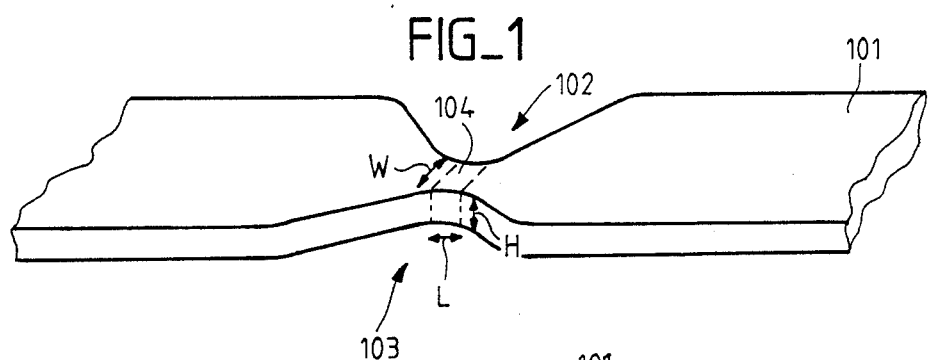
FIG_1
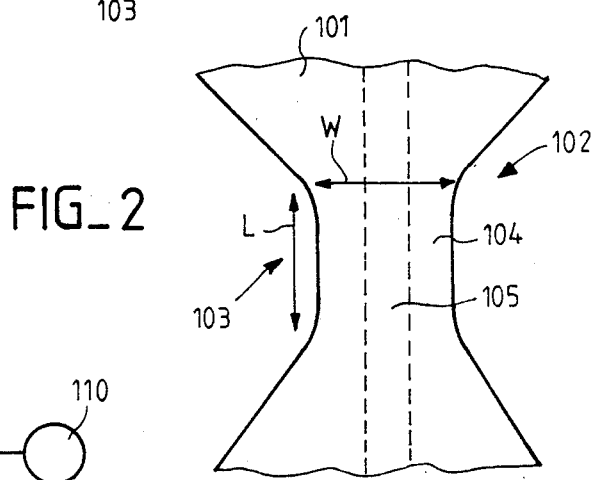
FIG_2
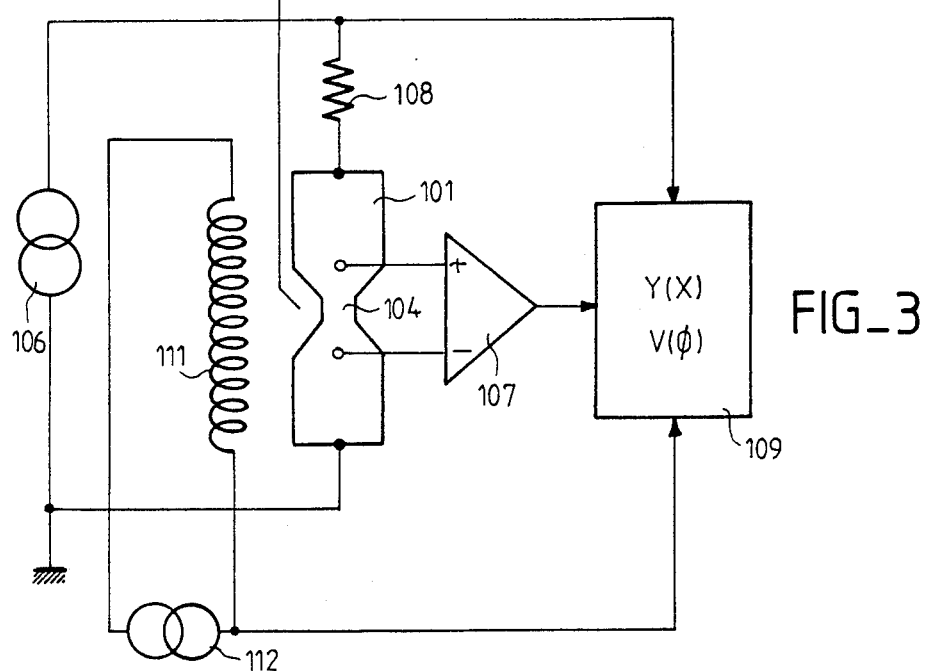
FIG_3

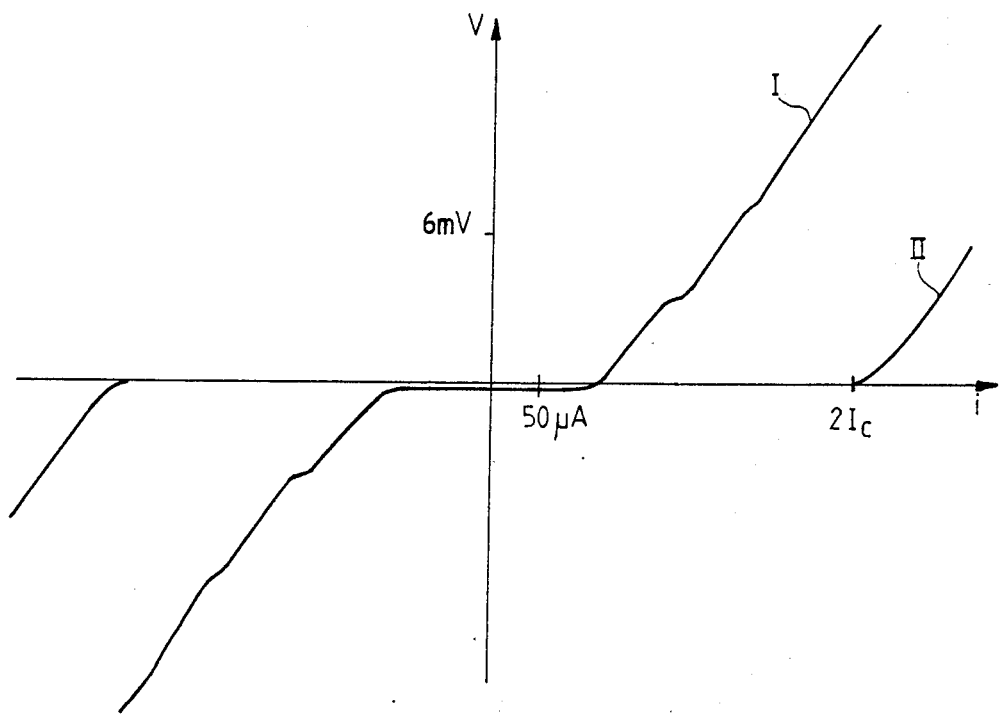
FIG_4
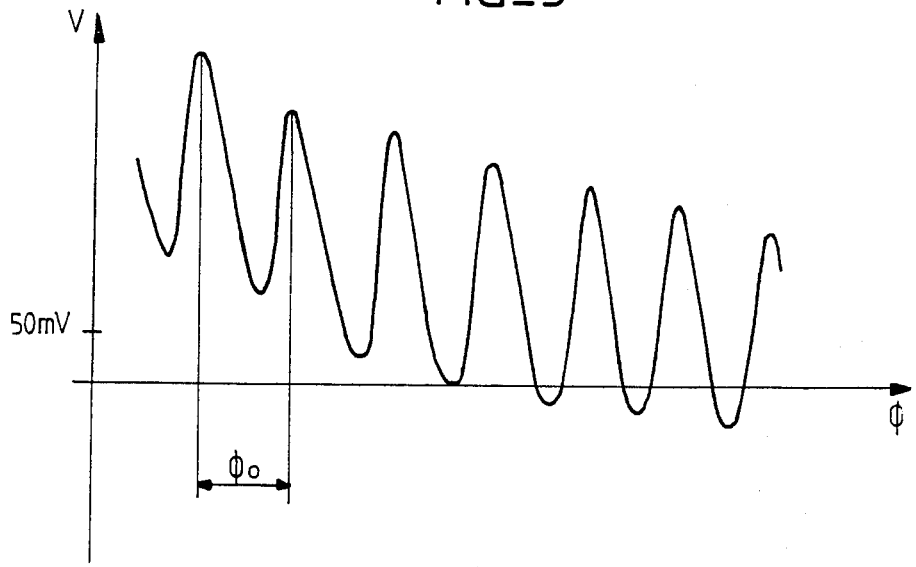
FIG_5

SUPERCONDUCTING DC SQUID MAGNETOMETER WORKING IN LIQUID NITROGEN

BACKGROUND OF THE INVENTION

1. Field of the Invention

The present invention relates to superconducting magnetometers that use the Josephson effect and are known as SQUIDs.

2. Description of the Prior Art

The use of a superconducting material to make a magnetometer using the Josephson effect is known. This device enables the detection of magnetic fields with weakness of as low as $10^{-15}$ tesla/$\sqrt{Hz}$. The prior art in this technique is discussed in an article by Brian William Petley in *La Recherche* No. 133, May 1982. Until recently, superconducting materials had this type of effect only at very low temperatures, cf about a few degrees Kelvin. This meant that they had to be cooled with liquid helium. For this purpose, bulky and delicate cryostats, which are costly to operate, had to be used.

Recently, materials such as $Y Ba_2 Cu_3 O_{8-x}$ have been discovered. These materials have a superconducting critical transition temperature of about 93° K., and can therefore work in liquid nitrogen which has a boiling temperature of 77° K.

Gouch et al. of Birmingham University have replaced the niobium loop of a radiofrequency (RF) SQUID, available in the market, by a ring manufactured with a material of this type, and have demonstrated the existence of intrinsic loops in the ring.

Similarly, Pegrum and Donaldson of the University of Strathclyde have replaced this niobium loop by a simple piece of new material with a roughly parallelepiped shape, and have demonstrated the existence of intrinsic loops inside this material, thus opening up the possibility of detecting fields in the range of $10^{-8}$ to $10^{-10}$T.

In these experiments, the sensitivity is limited by a noise which causes high dispersal and great uncertainty. This noise is attributed to the existence of multiple loops inside the material, leading to multiple periods which are randomly superimposed on one another. Koch et al. of the IBM Research Center, Yorktown Heights, have built a SQUID in which the sensitive element used is a thin film of this new material, machined by ion implantation to form an adequate loop. Unlike the one used in the above experiments, this SQUID is of the DC type and therefore works with a DC current bias. However, it has not been possible to obtain superconductive operation at temperatures above 68° K., and the results obtained clearly show that the loop used is superconductive only on a small portion and that the curves are, in fact, akin to a network of junctions with a poorly defined transition wherein the effect observed corresponds to a resistive commutation assisted by the Joule effect of the normal neighboring conductor.

SUMMARY OF THE INVENTION

According to the invention, the element used as the sensitive element of a DC SQUID is a fragment of superconducting material with temperatures at least equal to the boiling temperature of liquid nitrogen, said fragment having a central constriction which makes it possible to obtain a behaviour similar to that of a single loop.

BRIEF DESCRIPTION OF THE DRAWINGS

Other features and advantages of the invention will appear more clearly from the following description, given as a non-restrictive example and made with reference to the appended figures, of which:

FIG. 1 shows a cavalier projection of a sensitive element according to the invention;

FIG. 2 shows an enlarged view of the central part of this element;

FIG. 3 shows a drawing of a SQUID using this element;

FIG. 4 shows a characteristic curve of the SQUID, and

FIG. 5 shows an interference curve of the SQUID.

DESCRIPTION OF A PREFERRED EMBODIMENT

FIG. 1 shows the sensitive element of a SQUID according to the invention. This SQUID consists of a small bar of $Y Ba_2 Cu_3 O_{8-x}$, about 1 cm. long and 5 mm. wide. These dimensions are relatively unimportant, the essential feature being the fact that, towards its middle, this bar has a constriction consisting of two V-shaped notches, 102 and 103. These notches are got, for example, by sand blasting through a metallic mask or by means of a pulsed laser. The shape itself of these notches is of minimal importance, their essential feature being that they demarcate a substantially linear channel with a width W, a length L and a thickness H. The thickness H corresponds to the thickness of the bar 101 when this thickness is sufficiently small, for example 0.2 mm. For this, the bar H may be cut out from a plate having this same thickness by manufacture, or it may be then machined by grinding until this thickness is obtained. If the bar available is too thick, it can also be machined to form two other V-shaped notches on its top and bottom faces in order to obtain the desired thickness of the central channel. In a preferred embodiment, this thickness and length are, respectively, W=0.5 mm. and L=0.3 mm.

To further reduce the dimensions of the active part of the channel, the walls of this channel are treated in a known way by applying short, intense current pulses (of a few $\mu$s and a few $\mu$A to the ends of the bar 101. Owing to skin effect, these current pulses bring the surface of the grains on the surface of the bar to melting temperature, thus modifying the inter-grain junctions and lowering the critical temperature locally. It thus becomes possible to demarcate another central, active channel 105, shown in FIG. 2, in the first channel. The width of this channel 105 is preferably about 0.1 mm.

This bar is then made to replace the niobium loop of a prior art DC SQUID, the drawing of which has been shown in FIG. 3.

In this device, the strip 101 is supplied with DC current between its ends by an adjustable current source 106. The voltage upline and downline of the constriction 104 is picked up by two electrodes connected to the + and − inputs of a differential amplifier 107, the connection being got by means of an impedance matching. A resistor 108, series mounted between the bar 101 and the generator 106, makes it possible to determine the value of the current in the bar. A display device 109, connected firstly to this resistor 108 and, secondly, to the output of the amplifier 107, enables the obtaining of the curve Y(X), which represents variations in voltage at the terminals of the channel 104 according to the current flowing through the bar 101.

FIG. 4 shows these voltage/intensity curves in two particular cases.

The curve I corresponds to a particular experiment designed to highlight the occurrence of the Josephson effect in the bar 101. For this, a generator 110 with an 8.6 GHz radiofrequency field is added to the device of FIG. 3, and the signal of this generator is applied to the bar 101. Under the effect of this field, the curve I is obtained. This curve has steps known as Shapiro steps, which are characteristic of the occurrence of the Josephson effect. The height of these steps shows that there are no series junctions. The sharpness of this curve, as well as that of the following ones, clearly shows that the device behaves as if there were a single loop, comprising ordered junctions on a flux range of a few tens of $\phi_0$.

The curve II is obtained by increasing the current, without a radiofrequency field, from a negative value to a positive value within sufficiently broad limits to exceed the critical current Ic of the junctions beyond which the material stops being superconductive. This critical current is detected by the appearance of a voltage which is no longer null since the resistance goes from a null value to a finite value.

In the embodiment described, the value of the critical current Ic is substantially equal to 175μA. To enable the use of the device as a magnetometer, the current given by the generator 106 is then set at a constant value which is very slightly greater than the critical current. Using a coil 111, powered by a generator 112, the bar 101 is then placed in a variable magnetic field. The effects of this magnetic field get combined with the effects of the intrinsic magnetic field provided by the current flowing in the bar and, therefore, modify the critical current value. By then applying the measurement of the intensity given by the generator 112, which is proportionate to the field of the coil, to the display device 109, we obtain the curve representing the value of the voltage at the terminals of the channel 104 as a function of the flux $\mu$ flowing in the bar which is proportionate to the field of the coil. This curve is called an interference figure.

The coil 111 may consist, for example, of a solenoid within which the bar 101 is placed, or it may consist of two Helmholtz coils surrounding this bar. It has been observed that the orientation of this coil 111 has little effect on the results. This fact corresponds to a certain isotropy of the measurement of the field.

In supplying the coil 111 with an AC current having a frequency ranging from 10 Hz to 100 Khz, the curve $V(\phi)$, shown in FIG. 5, is thus obtained. In this curve, the period of the ripples corresponds to the quantum $\phi_0$ of flux in the equivalent SQUID loop of the bar.

The field to be measured counters the influence of the field provided by the coil 111 and, therefore, causes a modulation of the voltage V. To measure this field, a point of operation is chosen on the curve of FIG. 5, at a place where the variation in voltage as a function of the variation in the field is at its maximum, namely at a place where $dV/d\phi$ is at its maximum. This figure clearly corresponds, in the figure, to the center of one of the rising edges of one of the ripples. The exact value is a function of the useful sensitive element and is fixed by calibration.

This DC field is got by applying a DC current in the coil 111 by means of the generator 112. With the bar 101 thus polarized in intensity and field, the field applied by the coil 111 is made to oscillate slightly by modulating the generator 112 so as to have a field amplitude which is slightly smaller than $\phi_0/2$ thus making it possible to describe an amplitude, at the voltage V, corresponding to the amplitude of a front edge of a ripple. In the example described, the amplitude of the field was $4.10^{-7}$T.

The field to be measured, which is then superimposed on the field of polarization given by the coil 111, causes a shift in the mean point of the total field applied to the bar 101 and, hence, a very fast change in the output voltage of the amplifier 107 since one of the ends of the ripple is exceeded, on one side or the other, at one of the limits of the deviation of the AC magnetic field.

The measurements, in the embodiment described, gave a sensitivity $dV/d\phi$ equal to $30\mu v/\phi_0$ and a noise level below $0.1$ nV/$\sqrt{Hz}$/ This noise also corresponds essentially to the noise of the electronic equipment used and may be reduced by using electronic equipment with higher performance characteristics. In the example described, the noise of this amplifier was $4.4$ nV/$\sqrt{Hz}$ to 10 Hz.

The mean efficient diameter of the SQUID loop at 50 um could be measured from the dimensions of the installation and from the results of the measurement as well as from the measurements of the grain size of the material.

Under these conditions, a field sensitivity substantially equal to $0.1$ pT$\sqrt{Hz}$ and a sensitivity to flux in a white noise zone, of about $3.10^{-6}\phi_0/\sqrt{Hz}$ is obtained.

The device thus described is therefore a DC SQUID type sensor, working at the temperature of liquid nitrogen and using the Josephson junctions intrinsic to bulky material. The geometry used for this material enables the cancellation of the superimposition of the signals coming from a great number of independent loops and enables it to get polarized on one and the same junction.

The sensitivity values obtained are far better than those of the best RF SQUIDs used in liquid helium, and are equivalent of those of a good DC SQUID which also works in liquid helium.

What is claimed is:

1. A superconducting magnetometer of the DC SQUID type, comprising a piece of material which is superconductive at a temperature at least equal to that of liquid nitrogen and having a constriction by which it is possible to limit the number of useful intrinsic loops in the material and to obtain a behaviour equivalent to that of a single loop, first polarizing means to make a DC current flow in this piece, second polarizing means to subject this piece to a magnetic field of polarization and means to measure the voltage appearing in the piece wherein the piece of superconducting material is shaped substantially like a flat bar with a central constriction formed by two hollow V-shaped notches, facing each other, on the large sides of the bar to determine a first central channel, wherein the flanks of the channel are treated so that the superconductive effect is modified on the surface in order to demarcate a second central channel which is narrower than the first channel.

2. A device according to claim 1, wherein the thickness of the first channel is substantially equal to 0.2 mm. its length is substantially equal to 0.3 mm. and its width is substantially equal to 0.5 mm.

3. A device according to claim 1, wherein the width of the active second channel, demarcated by the treated walls, is substantially equal to 0.1 mm.

* * * * *